United States Patent [19]
Childers

[11] Patent Number: 5,216,290
[45] Date of Patent: Jun. 1, 1993

[54] PROCESS OF CONSERVING CHARGE AND A BOOSTING CIRCUIT IN A HIGH EFFICIENCY OUTPUT BUFFER WITH NMOS OUTPUT DEVICES

[75] Inventor: Jimmie D. Childers, Missouri City, Tex.

[73] Assignee: Texas Instruments, Incorporated, Dallas, Tex.

[21] Appl. No.: 807,953

[22] Filed: Dec. 10, 1991

Related U.S. Application Data

[63] Continuation of Ser. No. 488,622, Feb. 20, 1990, abandoned, which is a continuation of Ser. No. 259,686, Oct. 19, 1988, abandoned.

[51] Int. Cl.$^5$ .................... H03K 17/16; H03K 19/096
[52] U.S. Cl. .................... 307/296.1; 307/482; 307/264; 307/578; 307/491
[58] Field of Search ............ 307/443, 448, 451, 482, 307/263, 264, 296.1, 491, 571–572, 268, 578

[56] References Cited

U.S. PATENT DOCUMENTS

| | | | |
|---|---|---|---|
| 3,927,334 | 12/1975 | Callahan | 307/482 |
| 4,077,031 | 2/1978 | Kitagawa et al. | 307/578 |
| 4,110,637 | 8/1978 | Rusznyak | 307/238 |
| 4,633,106 | 12/1986 | Backes et al. | 307/578 |
| 4,916,334 | 4/1990 | Minagawa et al. | 307/482 |

Primary Examiner—William L. Sikes
Assistant Examiner—Margaret Rose Wambach
Attorney, Agent, or Firm—Ronald O. Neerings; Lawrence J. Bassuk; Richard B. Havill

[57] ABSTRACT

In one described embodiment of the present invention, an N-type metal oxide semiconductor (NMOS) output buffer boosts the voltage level on the gate of the pull-up device to improve output voltage level. In the prior art, the charge used to boost the output device is discharged to ground and the boot cap is recharged from the power supply. In this described embodiment, the circuit conserves most of the charge within the circuit by pulling the charge off of the output device back onto the boosting capacitor and isolating the boosted gate from the boosting capacitor. This technique does not slow the operation of the output buffer. There is no speed loss in doing this. The circuit uses about ½ to ⅓ the power of conventional output buffers.

5 Claims, 2 Drawing Sheets

PROCESS OF CONSERVING CHARGE AND A BOOSTING CIRCUIT IN A HIGH EFFICIENCY OUTPUT BUFFER WITH NMOS OUTPUT DEVICES

This application is a continuation of application Ser. No. 07/488,622, filed Feb. 20, 1990, now abandoned, which is a continuation of application Ser. No. 07/259,686, filed Oct. 19, 1988, now abandoned.

FIELD OF THE INVENTION

The present invention relates to the field of integrated circuit technology. More specifically, the present invention relates to circuits for providing a boosted voltage level in integrated circuitry.

BACKGROUND AND SUMMARY OF THE INVENTION

In the operation of some integrated circuits, it is necessary to provide a voltage level on the integrated circuit which is higher than the highest voltage level provided by the power supplied to the integrated circuit. This higher voltage is known as "boosted" or "booted" (as an abbreviation for boot-strapped). A particular instance where a boosted signal is required is in the output buffering of N-type MOS circuits. In these circuits, the pull-up transistor is an N channel transistor. To provide a high output signal meeting operating specifications, the full positive supply voltage ($V_{dd}$) must be provided. However, with the source of an N-type field effect transistor and the gate of the field effect type transistor connected to $V_{dd}$, the maximum output voltage available on the drain of the N-type field effect transistor is $V_{dd}$ less $V_{th}$, where $V_{th}$ is the threshold voltage of the field effect transistor. One method of solving this problem is to boost the voltage applied to the gate of the field effect transistor.

In order to pull the output voltage up to a full $V_{dd}$ voltage level, a voltage level greater than $V_{th}$ above $V_{dd}$ must be applied to the gate of the pull-up transistor. This voltage is generated by boosting the voltage applied to the gate of the field effect transistor. A common technique for boosting the voltage is a circuit where a capacitor is charged by applying the reference voltage of the circuit, $V_{ss}$, to one plate of the capacitor and $V_{dd}$ to the other plate of the capacitor. The plate of the capacitor connected to $V_{dd}$ is also connected to the gate of the pull-up transistor. At the appropriate time for boosting, the $V_{dd}$ source to the high voltage plate of the capacitor is removed and the high voltage plate of the capacitor and the gate of the pull-up transistor are isolated. The voltage applied to the low voltage plate of the capacitor is then raised to $V_{dd}$. The charge stored on the capacitor is then distributed between the capacitor and the gate of the pull-up transistor. Thus the voltage on the gate of the pull-up transistor is raised to a level higher than $V_{dd}$. In order to turn the pull-up transistor off, the high voltage charge now on the gate of the pull-up transistor must be removed. This is usually done by providing a transistor which provides a conductive path from the gate to $V_{ss}$ at the appropriate time. However, this type of arrangement dissipates the charge on the gate of the transistor through to ground thus wasting the power used to generate the boosting charge.

SUMMARY OF THE INVENTION

The described embodiments of the present invention provide circuitry whereby charge used to boost a particular node in a circuit is conserved by pulling the charge back on to the boosting capacitor before pulling the voltage level of the boosted node to a low voltage level. A pass transistor is placed between the boosting capacitor and the boosted node. Before the boosted node is pulled to a low voltage level, the voltage level applied to the non-boosting plate of the capacitor is reduced to a low voltage level. This low voltage level pulls the charge off of the boosted node thereby placing a substantial portion of the boosted charge back onto the boosting capacitor. The pass transistor is then turned off, thereby isolating the boosting capacitor and the boosted node. Pull down circuitry is then applied to the boosted node to reduce the voltage level of the boosted node to a low voltage level. In a particular embodiment herein described, this boosting circuit is applied to the pull-up transistor of an output buffer.

BRIEF DESCRIPTION OF THE DRAWINGS

The invention is best understood with regard to the described embodiment in the following Detailed Description in conjunction with the drawings, wherein.

DETAILED DESCRIPTION

Figure 1:
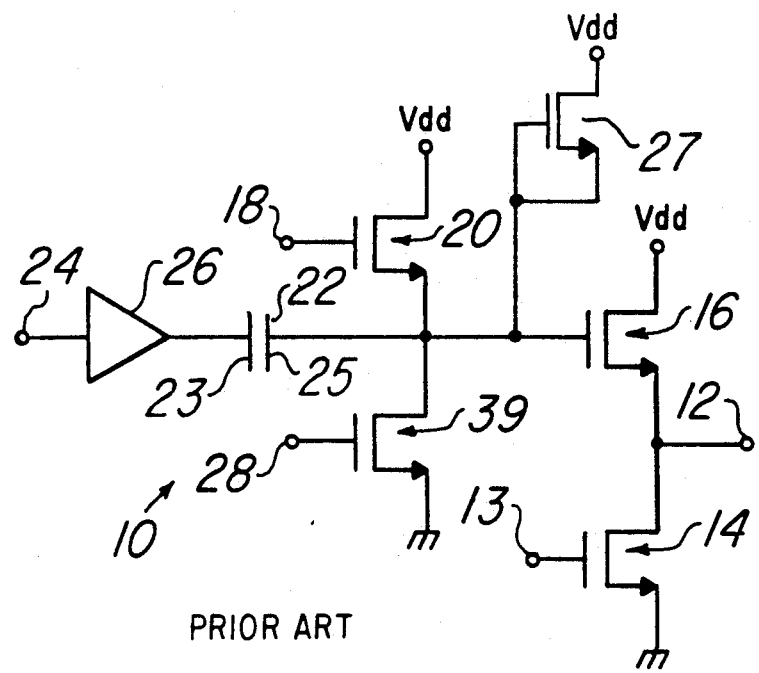
FIG. 1 is a schematic diagram of a prior art output buffer using a boosting circuit.

The described embodiment of the present invention is best understood when compared with the prior art as shown in FIG. 1. FIGS. 2a through 2e are timing diagrams illustrating the operation of the circuit of FIG. 1. FIG. 3 represents an embodiment of the present invention when utilized as a boosting circuit for an output buffer. FIGS. 4a through 4h are timing diagrams illustrating the operation of the circuit of FIG. 3.

Output buffer 10 of FIG. 1 provides the desired output signal on output terminal 12. When a logical 0 (low voltage) signal is to be provided on output terminal 12, a logical 1 (high voltage) signal is provided on terminal 13 which causes transistor 14 to be ON. (For purposes of this specification, a transistor is said to be "ON" when there is a conductive channel between source and drain of that transistor. Conversely, a transistor is said to be "OFF" when there is no conductive channel between the source and drain of that transistor.) When transistor 14 is ON transistor 16 must be OFF to prevent a direct conduction path between the positive voltage supply $V_{dd}$ and ground or $V_{ss}$. If a low voltage signal is provided on input terminal 13 and a logical 0 or low voltage signal is provided at the gate of transistor 16, both transistors 14 and 16 are OFF and a high impedance occurs at on output terminal 12. To provide a logical 1 (high voltage) output signal on output terminal 12, a logical 1 or high voltage signal is provided on input terminal 18 which causes transistor 20 to be ON. Without some method of boosting the signal provided to gate of transistor 16, a voltage threshold, $V_{th}$, occurs across the gate and drain of both transistors 20 and 16 when those transistors are ON. If $V_{dd}$ is the logical 1 or high voltage applied to input 18, the maximum voltage occurring at output terminal 12 would be $V_{dd}$ minus 2 $V_{th}$. In many applications this voltage drop is unacceptable and a method for overcoming this voltage drop must be applied. To accomplish this in this circuit, means are provided for boosting the voltage applied to the gate of transistor 16 well above $V_{dd}$. This is accomplished by charging capacitor 22 and forcing the charge placed on capacitor 22 on the gate of transistor 16.

While transistor 20 is ON, a low voltage signal is provided to input terminal 24 and fed to buffer 26. Buffer 26 provides this low voltage signal on one plate 23 of capacitor 22. After capacitor 22 is fully charged by having $V_{dd}$ minus $V_{th}$ placed on one plate 25 through transistor 20 and a low voltage signal provided on the other plate 23, the signal on terminal 18 is changed from a high to a low signal and the signal provided on terminal 24 is changed from a low to a high signal. At that instant, the voltage on the plate 25 of capacitor 22 connected to the gate of transistor 16 is the high voltage signal provided by output buffer 26 (approximately $V_{dd}$) plus the voltage of $V_{dd}$ minus $V_{th}$ representing the charge still stored on capacitor 22. This charge will distribute between the gate of transistor 16 and the plate of capacitor 22 connected thereto. A voltage much higher than $V_{dd}$ is thus placed on the gate of transistor 16. This voltage is dependent upon the relative capacitances of capacitor 22 and the gate of transistor 16. In this type of circuit, the voltage level provided to the gate of transistor 16 is often limited by techniques such as series strapped transistor 27 forming a forward biased diode from the gate of transistor 16 to $V_{dd}$ such as series gate strapped transistors connected between $V_{dd}$ and the gate of transistor 16.

In order to turn transistor 16 OFF, a high voltage signal is placed ON terminal 28 which causes transistor 30 to be on. Transistor 30 discharges the stored charge from capacitor 22 and the gate of transistor 16 to ground. With transistor 16 off, output buffer 10 provides either a low voltage output signal or a high impedance output on output terminal 12 depending upon the signal provided on terminal 13.

Figure 2:
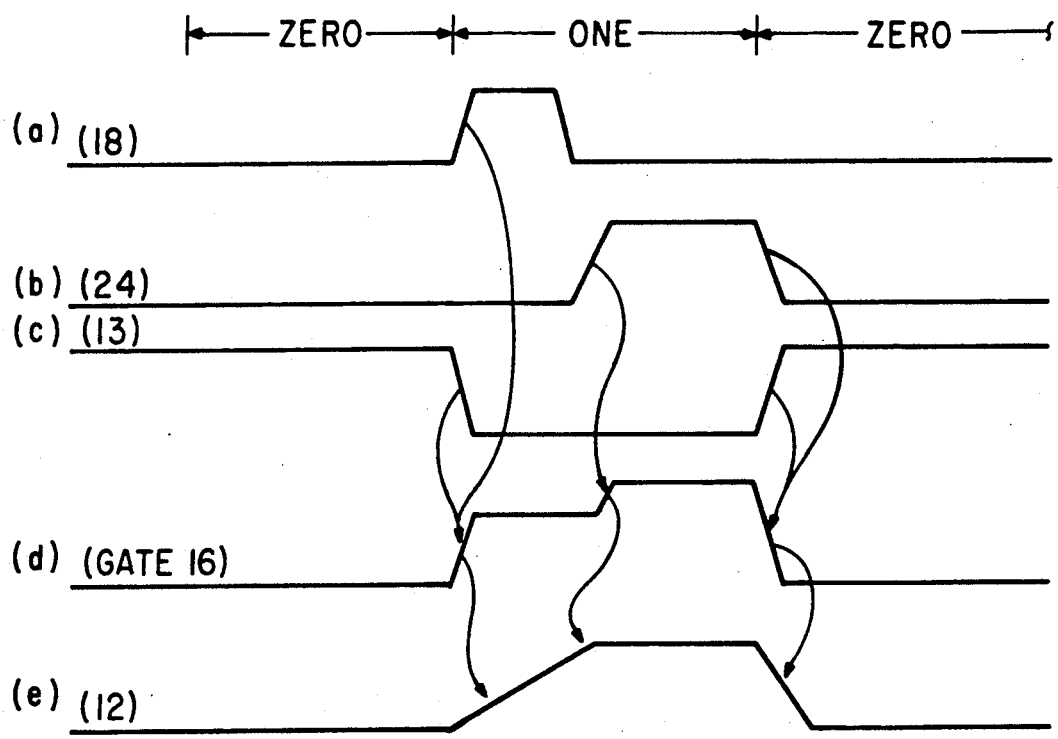
FIG. 2 depicts timing diagrams illustrating the operation of the circuit of FIG. 1.
Figure 3:
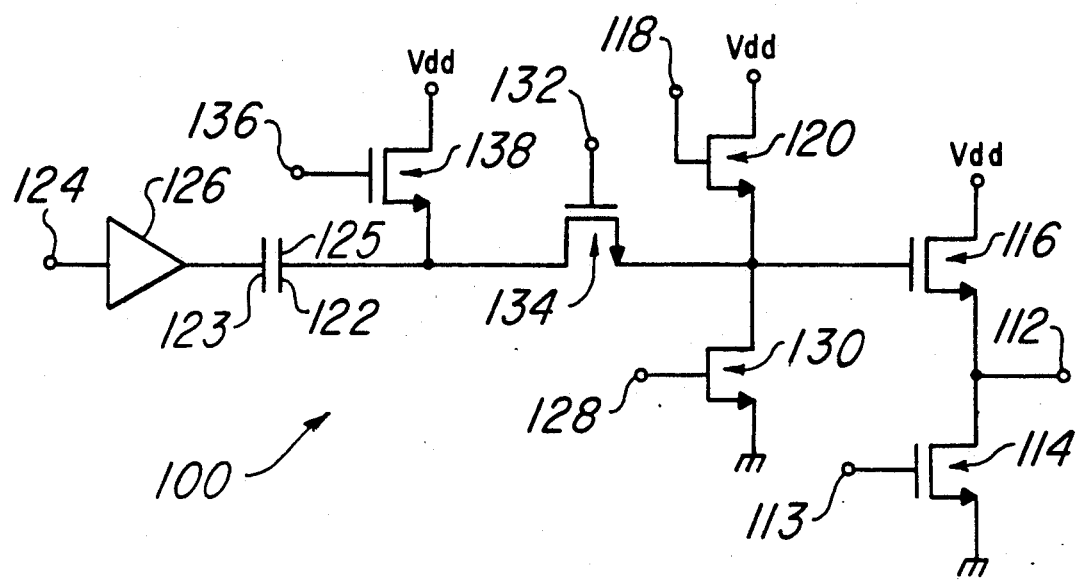
FIG. 3 is a schematic diagram of one embodiment of the present invention.

FIGS. 2a through 2e illustrate the operation of output buffer 10 in the transition from a logical 0 output signal on output terminal 12 to a logical 1 output signal on output terminal 12 and back to a logical 0 output signal on output terminal 12. FIG. 2(a) depicts the logical 1 or high voltage signal applied to terminal 18, which causes transistor 20 to be ON. FIG. 2(b) depicts the signal on terminal 24 changing from a low to a high to a low signal. FIG. 2(c) depicts the signal on terminal 13 going from a high to a low to a high signal. FIG. 2(d) depicts the voltage on the gate of transistor 16 going to a high level, being boosted higher and going low. FIG. 2(e) depicts the voltage changes on terminal 12. Because transistor 16 (FIG. 1) is a large transistor for adequate current handling capacity, the output signal on output terminal 12 provides a slower transistion from logical 0 to logical 1 than the driving transistors of output buffer 10. As indicated in FIGS. 2d and 2e the last portion of the rise of the signal on output terminal 12 is provided by the additional boost provided on the gate of transistor 16 (FIG. 1).

Output buffer 10 of FIG. 1 effectively provides the desired output signal on output terminal 12. However, because capacitor 22 must be charged through transistor 20 and subsequently discharged through transistor 30, a great deal of charge is passed from $V_{dd}$ to ground thereby wasting power.

FIG. 3 is a schematic diagram of an N type MOS output buffer similar in operation to upper buffer 10 of FIG. 1 but including improvements which are one embodiment of the present invention. A low voltage signal is provided on output terminal 112 by a high voltage signal applied to terminal 113 thus causing transistor 114 to be on. If a low voltage signal is provided on terminal 113 and a low voltage signal is provided on the gate of transistor 116, a high impedance output is provided on output terminal 112. To provide a logical 1 or high voltage output signal on output terminal 112, a high voltage signal is applied to terminal 118 which causes transistor 120 to turn ON. Solely using the drive from transistor 120, the output signal provided on output terminal 112 will be the voltage signal applied to terminal 118, usually $V_{dd}$, less the two threshold voltage drops from the gate to the drain of transistors 120 and 116. To provide a full $V_{dd}$ output voltage signal on output terminal 112 the voltage level of the gate of transistor 116 is boosted by a boosting signal provided by capacitor 122.

When transistor 116 is OFF, a low voltage signal is provided on terminal 132 which causes pass transistor 134 to be OFF. Thus capacitor 122 and transistor 116 are isolated. During this period of time, a high voltage signal is provided on terminal 136 which causes transistor 138 to be ON thus charging one plate 125 of capacitor 122. Also during this time a low voltage signal is provided on terminal 124 through buffer 126 to the other plate 123 of capacitor 122. When transistor 116 is to be turned ON, a high voltage signal is applied to terminal 118 which pulls the gate of transistor 116 to a level of $V_{dd}$ minus $V_{th}$. The signal on terminal 132 is then raised from a low voltage signal to a high voltage signal thus turning on transistor 134. The signal provided on terminal 124 is then raised from a low voltage signal to a high voltage signal, thus boosting the voltage level on the opposite plate 125 of capacitor 122 to that high voltage level plus the voltage caused by the stored charge on capacitor 122. Because $V_{dd}$ is provided on input terminal 136 and $V_{dd}$ is provided on the source of transistor 138, the voltage level provided on the drain of transistor 138 which is boosted will be much higher than either of these voltages. Thus, transistor 138 will turn OFF. Because transistor 134 is ON, the stored charge on capacitor 122 will distribute between capacitor 122 and the gate of transistor 116. Thus the voltage level on the gate of transistor 116 will be raised a certain amount. However in order to provide full charging of the gate of transistor 116 a further boosting of the voltage provided on input terminal 132 is necessary so that transistor 134 will remain on. This can be done by conventional boosting circuitry, such as is depicted in FIG. 1.

When transistor 116 is to be turned OFF, a low voltage signal is placed on input terminal 124 which pulls the plate 123 of capacitor of 122 connected to buffer 126 to a low voltage level, thus a large portion of the charge on the gate of transistor 116 will be pulled to the plate 125 of capacitor 122 opposite buffer 126. The signal on terminal 132 is then pulled to a low voltage level thus causing transistor 134 to turn OFF. A high voltage signal is then placed on terminal 128 which turns ON transistor 130 and pulls the gate of transistor 116 to a voltage level near ground. Thus, transistor 116 is turned OFF. By pulling the boosting charge on the gate of transistor 116 back onto capacitor 122 and then isolating capacitor 122 and the gate of transistor 116, a substantial power savings is realized by conserving the boosting charge on capacitor 122 rather than discharging that charge through transistor 130. In addition, because the plate 125 of capacitor 122 opposite buffer 126 is constantly being charged through transistor 138, no charging time for capacitor 122 need be provided in the operation of the boosting circuit. Therefore, output buffer 100 operates more quickly and more efficiently than output buffer 10 of FIG. 1. Some additional power is consumed by the circuitry which boosts transistor 134, however, because transistor 116 is a power output transistor and is thus much larger than transistor 134. The additional power necessary to boost transistor 134 is relatively small.

Figure 4:
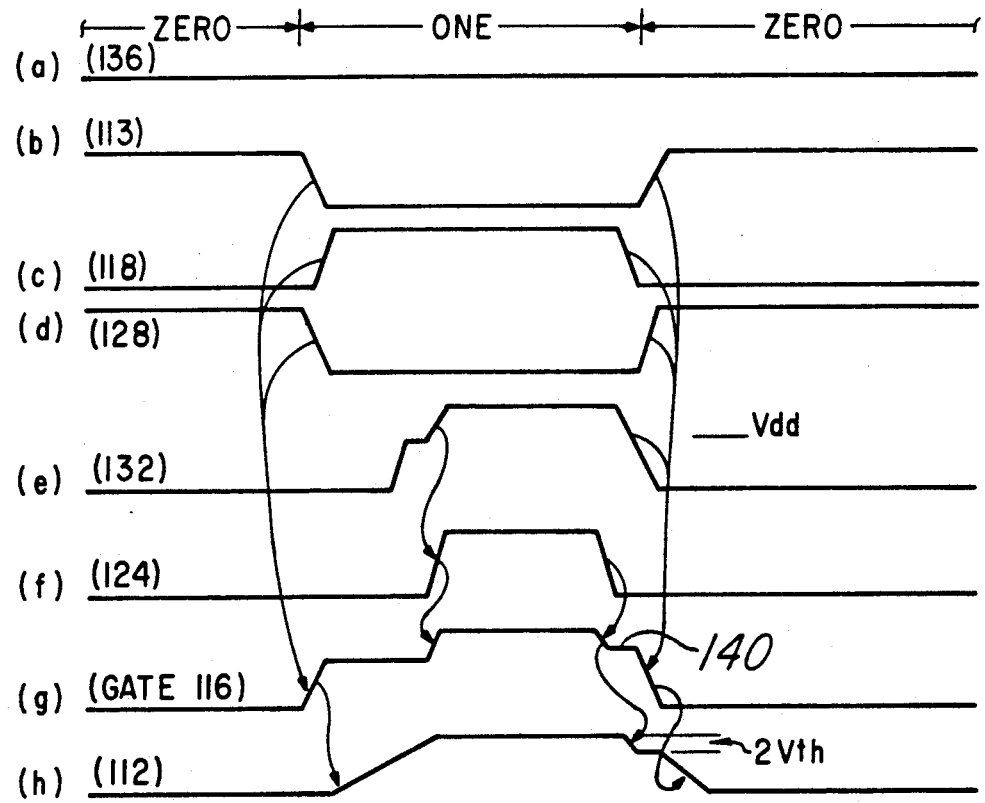
FIG. 4 depicts timing diagrams illustrating the operation of the embodiment of FIG. 3.

FIGS. 4a through 4h are timing diagrams illustrating the operation of output buffer 100 of FIG. 3. In the illustrated embodiment, the signal provided on input terminal 136 (FIG. 3) is a solid signal of $V_{dd}$ as shown in FIG. 4a. In other embodiments the signal on the gate of transistor 138 may be boosted to provide a $V_{dd}$ charge onto capacitor 122 (FIG. 3). FIG. 4(b) depicts the signal on terminal 113 going from a high, to a low and back to a high. FIG. 4(c) depicts the signal on terminal 118 going low, high and low. FIG. 4(d) depicts the signal on terminal 128. The signals on terminals 113, 118 and 128 cause the first increase in voltage on gate 116, FIG. 4(g). FIG. 4(e) depicts the boost control signal 132 to the gate of transistor 134 going high and being boosted above $V_{dd}$. FIG. 4(f) depicts the boost control signal 124 going from a low to a high and back to a low. The two boost control signals cause the boost in the voltage on gate 116. FIG. 4(h) depicts the voltage of the output signal 112, including the 2 $V_{th}$ notch at the beginning of the high to low transition. Because of the charge pulled back onto capacitor 122 (FIG. 3) before transistor 116 (FIG. 3) is completely turned off, a downward notch on the end of the transition from a 1 to a 0 occurs where the output signal on output terminal 112 is 2 $V_{th}$ less than $V_{dd}$. In most applications this notch 140 is of little importance.

Although the present invention is described in conjunction with a specific described embodiment, this is not to be construed as limiting the scope of the invention. The present invention finds wide applicability in the art where a boosted signal is useful, such as in high speed operation of digital circuits and other situations where specific signal conditions are required.

The scope of the present invention is limited only by the claims appended hereto, wherein we claim:

1. An output buffer having an output terminal requiring a first voltage equal to a supply voltage to indicate a certain logical condition, the buffer conserving boosting charge after boosting an internal voltage to obtain the first voltage at the output terminal, the buffer comprising:

a. an output transistor having a gate, a source and a drain, one of the source and drain being connected to the supply voltage and the other of the source and drain being connected to the output terminal, the gate receiving the internal voltage and the output transistor requiring the internal voltage to be boosted above the supply voltage to provide the supply voltage on the output terminal;

b. a capacitor having two plates, one plate being connected to a boost control terminal and the other plate being connected to a first node that receives an isolated internal voltage of about the supply voltage less a transistor threshold voltage;

c. a first boost control signal connected to the boost control terminal, the first boost control signal having a time selected high voltage of about the supply voltage to boost the voltage of the isolated internal voltage on the other plate of the capacitor to above the supply voltage at a desired time, and having a sequential low voltage of about a reference voltage to reduce the voltage on the other plate of the capacitor to below the supply voltage;

d. a pass transistor having a gate, a source and a drain, one of the source and drain being connected to the first node and the other of the source and drain being connected to the first node and the output transistor, the pass transistor conducting charge between the source and drain when a high voltage above the supply voltage is placed in on its gate and isolating the source and drain when a low voltage is placed on its gate; and e. a second boost control signal connected to the gate of the pass transistor, the second boost control signal having a high voltage above the supply voltage occurring in timed relation to the first boost control signal to conduct the voltage boosted above the supply voltage from the other plate of the capacitor to the gate of the output transistor and remaining after the end of the first boost control signal high voltage to return the voltage on the gate of the output transistor back to the other plate of the capacitor.

2. The output buffer of claim 1 in which the output transistor is an N-type field effect transistor and the supply voltage is positive relative to the reference voltage.

3. The output buffer of claim 1 in which the second boost control signal has a high voltage above the supply voltage before the first boost control signal has a high voltage.

4. The output buffer of claim 1 including a third transistor supplying voltage to the internal node at all times before, during and after the first and second boost control signals change states.

5. The output buffer of claim 1 including a third transistor supplying voltage to the gate of the output transistor when the pass transistor is non-conductive, and a fourth transistor removing voltage from the gate of the output transistor when the pass transistor is non-conductive, the fourth and fifth transistors operating separate from one another.

* * * * *